United States Patent
Canaperi et al.

(10) Patent No.: US 9,214,332 B2
(45) Date of Patent: Dec. 15, 2015

(54) COMPOSITE DIELECTRIC MATERIALS WITH IMPROVED MECHANICAL AND ELECTRICAL PROPERTIES

(71) Applicant: International Business Machines Corporation, New Orchard Road, NY (US)

(72) Inventors: Donald F. Canaperi, Bridgewater, CT (US); Alfred Grill, White Plains, NY (US); Son V. Nguyen, Schenectady, NY (US); Deepika Priyadarshini, Guilderland, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/220,288

(22) Filed: Mar. 20, 2014

(65) Prior Publication Data
US 2015/0270124 A1    Sep. 24, 2015

(51) Int. Cl.
*H01L 21/20* (2006.01)
*H01L 21/02* (2006.01)

(52) U.S. Cl.
CPC .... *H01L 21/02115* (2013.01); *H01L 21/02126* (2013.01); *H01L 21/02255* (2013.01); *H01L 21/02282* (2013.01)

(58) Field of Classification Search
CPC ............................ H01L 29/0665; B82Y 10/00
USPC ......... 257/2, 24, E21.211, E29.001; 438/396; 977/700, 938
See application file for complete search history.

(56) References Cited

U.S. PATENT DOCUMENTS

| | | | |
|---|---|---|---|
| 6,630,772 B1 | 10/2003 | Bower et al. | |
| 6,762,237 B2 | 7/2004 | Glatkowski et al. | |
| 8,350,360 B1 * | 1/2013 | Ngo | 257/532 |
| 8,394,727 B1 | 3/2013 | Afzali-Ardakani et al. | |
| 2004/0261978 A1 * | 12/2004 | Zhan et al. | 165/104.11 |
| 2005/0089684 A1 * | 4/2005 | Barron et al. | 428/408 |
| 2007/0155065 A1 * | 7/2007 | Borkar et al. | 438/149 |
| 2007/0210455 A1 * | 9/2007 | Wang et al. | 257/762 |
| 2010/0072445 A1 * | 3/2010 | Schricker et al. | 257/2 |
| 2010/0127268 A1 * | 5/2010 | Daniel et al. | 257/66 |

(Continued)

FOREIGN PATENT DOCUMENTS

JP    2008277077 A    11/2008

OTHER PUBLICATIONS

Anonymus, "Low-K Precursors Adapted for Incorporation of Porosity", An IP.com Prior Art Database Technical Disclosure, Jul. 15, 2009.
Park et al., "High-density integration of carbon nanotubes via chemical self-assembly", Nature Nanotechnology, Dec. 2012, pp. 787-791, vol. 7, Macmillan Publishers Limited.

(Continued)

*Primary Examiner* — Jami M Valentine
(74) *Attorney, Agent, or Firm* — Scully, Scott, Murphy & Presser, P.C.; Steven J. Meyers, Esq.

(57) ABSTRACT

A low k dielectric material with enhanced electrical and mechanical properties is provided which, in some applications, can also reduce the capacitance of a semiconductor device. The low k dielectric material includes CNT nanotubes that are randomly dispersed within a low k dielectric material matrix. The low k dielectric material can be used in a variety of electronic devices including, for example, as an insulator layer within a back end of line interconnect structure.

20 Claims, 2 Drawing Sheets

(56) References Cited

U.S. PATENT DOCUMENTS

| | | |
|---|---|---|
| 2010/0224836 A1 | 9/2010 | Kitamura et al. |
| 2011/0147715 A1* | 6/2011 | Rogers et al. .................. 257/24 |
| 2012/0056149 A1 | 3/2012 | Cleavelin et al. |
| 2012/0155801 A1* | 6/2012 | Donval et al. .................. 385/31 |
| 2012/0329287 A1 | 12/2012 | Gates et al. |
| 2013/0082233 A1 | 4/2013 | Afzali-Ardakani et al. |

OTHER PUBLICATIONS

Morishita et al., "A novel morphological model for carbon nanotube/polymer composites having high thermal conductivity and electrical insulation", Journal of Materials Chemistry, Feb. 24, 2011, pp. 5610-5614, vol. 21.

Prasher et al., "Turning Carbon Nanotubes from Exceptional Heat Conductors into Insulators", Physical Review Letters, Mar. 13, 2009, pp. 105901-1-105901-4, vol. 102, The American Physical Society.

* cited by examiner

COMPOSITE DIELECTRIC MATERIALS WITH IMPROVED MECHANICAL AND ELECTRICAL PROPERTIES

BACKGROUND

The present application relates to a composite dielectric material for use in semiconductor devices and a method of forming a composite dielectric material. More particularly, the present application relates to a composite dielectric material including carbon nanotubes (hereinafter "CNTs") randomly dispersed within a low dielectric constant dielectric material matrix and a method of forming such a composite dielectric material.

The continuous shrinking in dimensions of electronic devices utilized in ultra large scale integrated (ULSI) circuits in recent years has resulted in increasing the resistance of the interconnect metallization as well as increasing the capacitance of the intralayer and interlayer dielectric material. This combined effect increases signal delays in ULSI electronic devices. In order to improve the switching performance of future ULSI circuits, low dielectric constant (k) dielectric materials, and particularly those with a dielectric constant significantly lower than silicon dioxide, are needed to reduce the capacitance.

Low k dielectric materials are typically porous and hence wet chemical or gaseous species can penetrate into the pores of the low k dielectric material affecting the chemical nature of the film and degrading the electric properties. The mechanical strength of the low k dielectric material is also degraded, resulting in increased cracking during mechanical processing. There thus exists a need to produce low k dielectric materials with enhanced mechanical strength while retaining or improving their electrical properties.

In other methods, the prior art places CNTs on a substrate by first functionalizing the CNT and then placing the CNT directly on the substrate. However, such methods result in a low density of CNTs on the surface.

When present in films, CNTs are generally vertical and attached to substrates. These films generally exhibit low mechanical strength in the horizontal direction. Furthermore, the prior art vertical directional growth of the CNT with continuous tube growth from the bottom up can enable moisture to penetrate from top to bottom, or a contaminant to become trapped in the CNT during its exposure to various processing and fabrication environmental conditions. This moisture and/or trapping of contaminants will lead to a degradation of the film's properties and subsequently result in poor electronic device quality and reliability.

Accordingly, there exists a need in the art to overcome the deficiencies and limitations described hereinabove.

SUMMARY

In one aspect of the present application, a method of forming a composite dielectric material is provided. In accordance with an embodiment of the present application, the method may include providing, in any order, a solution containing a low dielectric constant (k) dielectric material precursor and another solution containing CNTs. A composite dielectric material is then deposited from the two solutions on a surface of a substrate.

In another aspect of the present application, a composite dielectric material is provided. The composite dielectric material of the present application includes a first dielectric material and a second dielectric material comprising CNTs, wherein the second dielectric material is randomly dispersed in the first dielectric material. By "randomly dispersed" it is meant that the CNTs are not confined to any specific orientation when dispersed in the first dielectric material.

In yet another aspect of the present application, a semiconductor structure is provided. In accordance with this aspect of the present application, the semiconductor structure includes a substrate having an upper surface; and a composite dielectric material located on said upper surface of the substrate. In accordance with the present application, the composite dielectric material includes a first dielectric material, and a second dielectric material comprising carbon nanotubes, wherein the second dielectric material is randomly dispersed in the first dielectric material.

DETAILED DESCRIPTION

Figure 1:
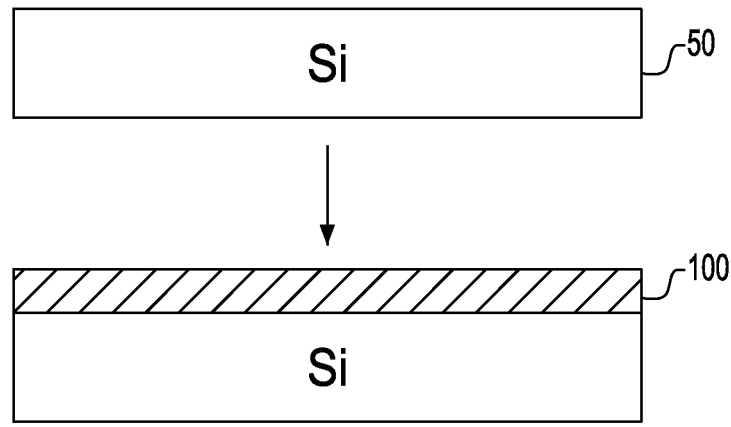
FIG. 1 illustrates a single mixed solution method of making a composite dielectric material in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

The present application provides a composite dielectric material that has a dielectric constant of 3.5 or less and with enhanced electrical and mechanical properties. In some embodiments, the composite dielectric material of the present application can reduce the capacitance of a semiconductor device. The composite dielectric material of the present application includes CNTs that are randomly dispersed within a dielectric material matrix. The composite dielectric material of the present application can be used in a variety of electronic devices including, for example, as an insulator layer within a back end of line (hereinafter "BEOL") interconnect structure.

In one aspect of the present application, a method for forming a composite dielectric material is provided. In one embodiment of the present application, the method includes providing, in any order, a solution containing CNTs and another solution containing a low dielectric constant (k) dielectric material precursor. The two solutions are applied to a surface of a substrate.

The term "substrate" as used throughout the present application denotes, a semiconductor material, an insulator material, a conductive material or any combination thereof, including multilayered structures. Thus, the substrate may be a semiconductor material such as Si, Ge, SiGe, SiGeC, SiC, III/V such as, for example, GaAs, InAs and InP, or II/VI compound semiconductors. The semiconductor substrate 50 may also include a layered substrate such as, for example, Si/SiGe, Si/Ge, Si/SiC, silicon-on-insulators (SOIs) or silicon germanium-on-insulators (SGOIs). When the substrate is an insulator material, the insulator material can be an organic insulator, an inorganic insulator or a combination thereof including multilayers. Exemplary insulator materials can include silicon dioxide, silicon nitride, doped silicate glass, and C-doped oxides containing atoms of Si, C, O and H. When the substrate is a conductive material, the substrate may include, for example, polySi, an elemental metal, alloys of elemental metals, a metal silicide, a metal nitride and combinations thereof, including multilayers. In some embodiments, the substrate includes a combination of a semiconductor material and an insulator material, a combination of a semiconductor material and a conductive material or a combination of a semiconductor material, an insulator material and a conductive material. In one example, the substrate may be a lower interconnect level of a multilevel interconnect structure that includes an interconnect dielectric having a conductive material such as, for example, Cu, Al or a Cu—Al alloy embedded therein.

The term "CNTs" as used throughout the present application denotes a one-dimensional nanomaterial that has a hollow cavity with nanometer-sized diameters as well as a three-dimensional nanomaterial. The CNTs that can be used in the present disclosure are single walled or multi-walled nanomaterials that typically have an outer diameter from 0.1 nm to 500 nm and a typical length from 0.5 nm to 500 µm. In another embodiment, the CNTs have an outer diameter from 1 to 20 nm. In addition to having an outer diameter, the CNTs that can be used in the present disclosure can have an inner diameter that is typically from 0.1 nm to 300 nm. In another embodiment, the CNTs have an inner diameter that is from 0.5 to 10 nm.

The CNTs used in the present application are made using techniques well known to those skilled in the art. For example, the CNTs can be formed by laser ablation, chemical vapor deposition of various organic materials, such as carbon monoxide, methane, and ethanol, and electrical discharge.

The solution containing the CNTs may comprise an aqueous solution that may contain from 0.1 to 1% of a surfactant or an organic solvent, such as, for example, $C_1$-$C_3$ alcohols, dichloroethylene, N-methylpyrolidone or dischlormethane. Non-limiting examples of surfactants that can be used in preparing the aqueous dispersion of carbon nanotubes include sodium dodecylbenzenesulfonic acid (SDS) and poly (oxyethylene)-substituted aromatic compounds such as Triton N-100 or Triton X-100.

The low k material employed in the present invention may be selected from any material that has a low dielectric constant (k of less than 3.5). Preferably, the low k material will contain silicon, i.e. Si, $SiO_2$ and siloxanes. More preferably, the low k material will contain silicon, carbon, oxygen and hydrogen.

Exemplary examples of low k SiCOH precursor materials of the present invention include, but are not limited to, 2,2,4,4,6,6-hexaethyl tricyclosiloxane (HETCS), 1,3,5,7-tetravinyl-1,3,5,7-tetramethylcyclotetrasiloxane and 1,3,5-trivinyl-1,3,5-trimethylcyclotrisiloxane, octamethylcyclotetrasiloxane (OMCATS) or tetramethyl cyclotterasiloxane (TOMCATS), or 2,4,6,8-tetravinyl-2,4,6,8-tetramethylcyclotetrasiloxane.

The pore size of the SiCOH materials are preferably 4-20 Å, more preferably 5-10 Å and most preferably 6-8 Å.

The solutions mentioned above can be referred to as dielectric material-containing precursors. In one embodiment, each solution can be introduced separately into a reactor chamber and then mixed within the reactor chamber prior to deposition on a surface of the substrate. In another embodiment, the solution containing the low dielectric constant dielectric material can be first introduced into the reactor chamber and depositing onto the substrate, prior to the introduction of solution containing the CNTs. In such an embodiment, the CNT component of the composite dielectric material is introduced into a previously deposited low k dielectric material.

The solutions can be applied onto the substrate by utilizing a deposition process such as, for example, a single mixed solution spin-coating or a multi-layer spin-coating. In one example, the spin coating may include utilizing the following conditions: depositing the solution(s) onto the center of a substrate and spinning the substrate of at a high speed (typically 1,500 to 6,000 rpm), which results in a thin film on the substrate. Other deposition processes that can be used include chemical vapor deposition and plasma enhanced chemical vapor deposition.

Following the deposition processes, a composite dielectric material of the present application is formed. That is, a composite dielectric material is formed that has a dielectric constant of less than 3.5. In some embodiments, the dielectric constant of the composite dielectric material that is formed is from 1.4 to 3.0.

As mentioned above, the composite dielectric material that is formed includes CNTs that are randomly dispersed within a dielectric material matrix. The dielectric material matrix comprises a dielectric material having a dielectric constant of 3.5 or less. In some embodiments, the dielectric material that provides the dielectric matrix may comprise atoms of silicon, carbon, oxygen and hydrogen. The dielectric material matrix prevents the formation of electrically conducting paths while still providing high mechanical strength.

The porosity of the composite material may be regulated by the amount of encapsulated matrix employed as well as the amount CNTs added to the dielectric matrix. A random network of CNTs formed in the encapsulating matrix also adds to the composite material's insulating behavior by exhibiting lower electrical conductivity.

In some embodiments of the present application, the length and diameter of the CNTs employed are controlled to obtain desired electrical, mechanical and film properties. The CNTs are oriented in a variety of random directions, not only the vertical direction. The CNTs may be encapsulated in a localized matrix within the low k material matrix for electrical insulation. Additionally, the low k dielectric for the BEOL semiconductor device may be formed by spin coating the low k material solution followed by spin-coating the CNT solution. These steps may be repeated to obtain the desired thickness, porosity, electrical properties and mechanical properties. The present application does not require a seed layer for growing CNTs.

In some embodiments, of the present application, the length and diameter of the CNTs employed are controlled to obtain desired electrical, mechanical and film properties. The CNTs are oriented in a variety of random directions, not only the vertical or horizontal direction. In some embodiments, non-metallic or oxidized CNTs can be used to obtain desired electrical, mechanical and film properties. In other embodiments, other types of insulating nanotubes, such as a boron nitride nanotube, silicon, and oxidized silicon (SiOx) nanotubes are encompassed by the present invention.

After applying the solutions onto the surface of the substrate, a curing step may be used to cure the deposited composite dielectric material. The curing step may be performed by subjecting the deposited composite dielectric material to an energy source. Suitable energy sources that can be used for curing include thermal, ultraviolet (UV) light, electron beam (E-beam), and plasma. Combinations of the aforementioned energy sources can also be used in the present application.

When a thermal energy source is used to cure the composite dielectric material of the present disclosure, the deposited composite dielectric material can be thermally cured at a temperature from 300° C. to 700° C. In another embodiment, the composite dielectric material is thermally cured at a temperature from 350° C. to 430° C. In some embodiments, the thermal cure can be performed in a non-oxidizing ambient. By "non-oxidizing ambient" it is meant an atmosphere in which the oxygen content is less than 20 ppm, typically less than 10 ppm. In some embodiments of the present invention, the curing is performed in an oxygen free atmosphere such as, for example an inert gas (e.g., He, Ar or mixtures thereof). Thermal curing may include a rapid thermal anneal, a furnace anneal, a laser anneal or a spike anneal.

When UV energy source is used to cure the composite dielectric material of the present disclosure, the deposited composite dielectric material can be subjected to light treatment step that can generate light having a wavelength from 500 to 150 nm, to irradiate the substrate while the substrate is maintained at a temperature from 25° to 500° C. In some embodiments, of the present application, the UV curing is performed utilizing a wavelength range from 150 to 370 nm. In another embodiment, of the present application, the UV curing is performed utilizing a wavelength range from 150 to 310 nm.

When an E-beam energy source is used cure the composite dielectric material of the present disclosure, the deposited composite dielectric material can be subjected to a source that is capable of generating a uniform electron flux over the substrater, with energies from 0.5 to 25 keV and current densities from 0.1 to 100 microAmp/cm$^2$, while the substrate temperature is maintained at a temperature from 25° to 500° C.

In some embodiments as shown, for example in FIG. 1, a single mixed solution of a low k SiCOH solution and a CNT solution may be spin coated on a substrate 50 to form a composite dielectric material 100.

Figure 2:
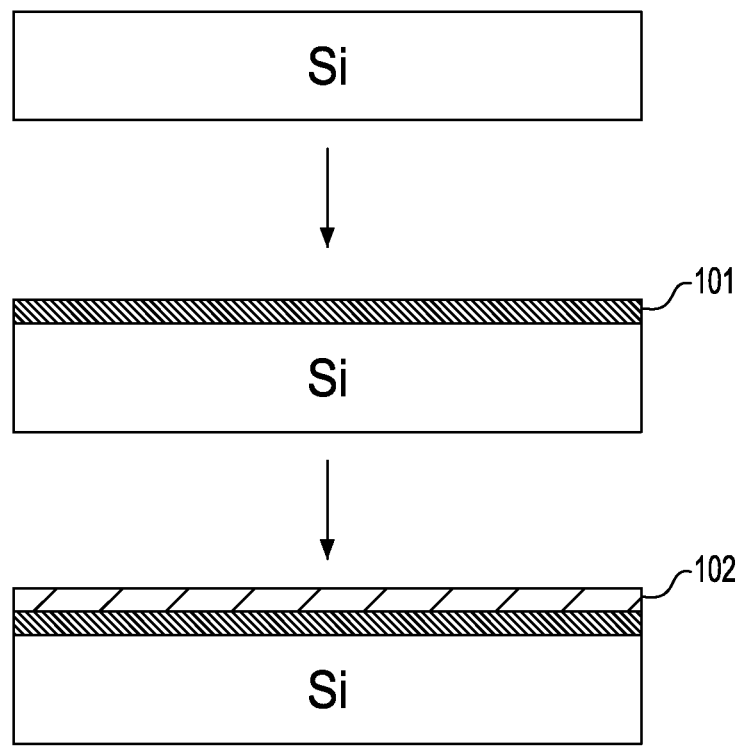
FIG. 2 illustrates a multi-layer coating method of making a composite dielectric material in accordance with another embodiment of the present application.

In other embodiments as shown, for example in FIG. 2, a low k SiCOH solution 101 is first spin coated onto substrate 50, then a CNT solution 102 is spin coated onto the low k SiCOH solution 101, forming a composite dielectric material.

Figure 3:
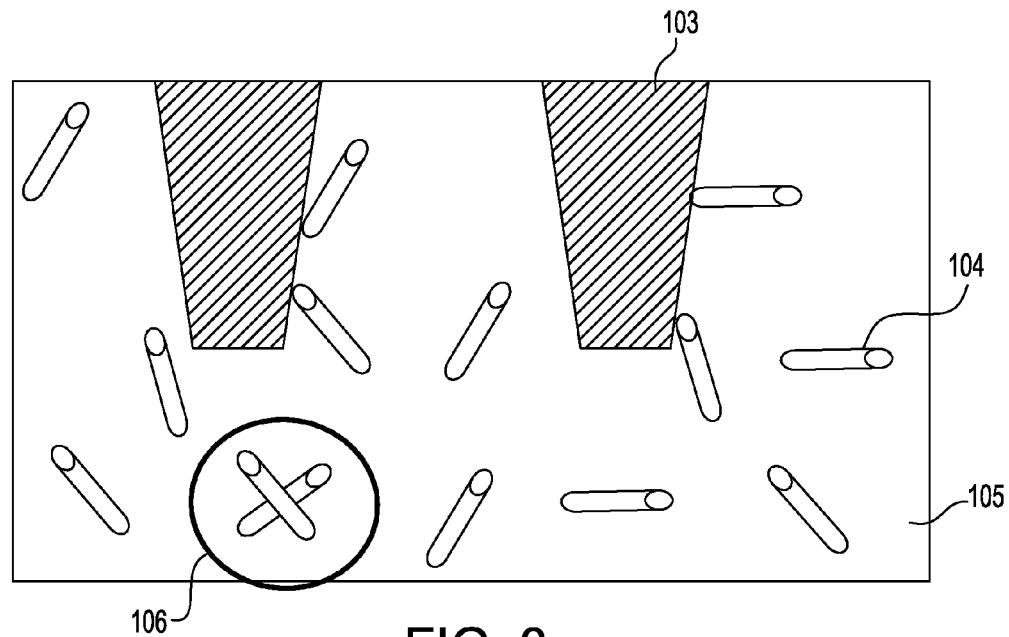
FIG. 3 illustrates a composite dielectric material of the present application that contains directionally random CNT's dispersed within a low k dielectric material, in accordance with an embodiment of the present application.

In some embodiments as shown, for example in FIG. 3, an electronic structure containing at least two metallic conductor elements 103 and a low k dielectric material 105 is provided. The inventive low k dielectric material 105 provides electrical isolation and low capacitance between the two conductors. CNTs 104 and 106 are present in random orientation throughout the film in order to increase the strength of the film in all directions.

The at least two metal conductor elements are patterned in a shape required for a function of a passive or active circuit element including, for example, an inductor, a resistor, a capacitor, or a resonator.

Figure 4:
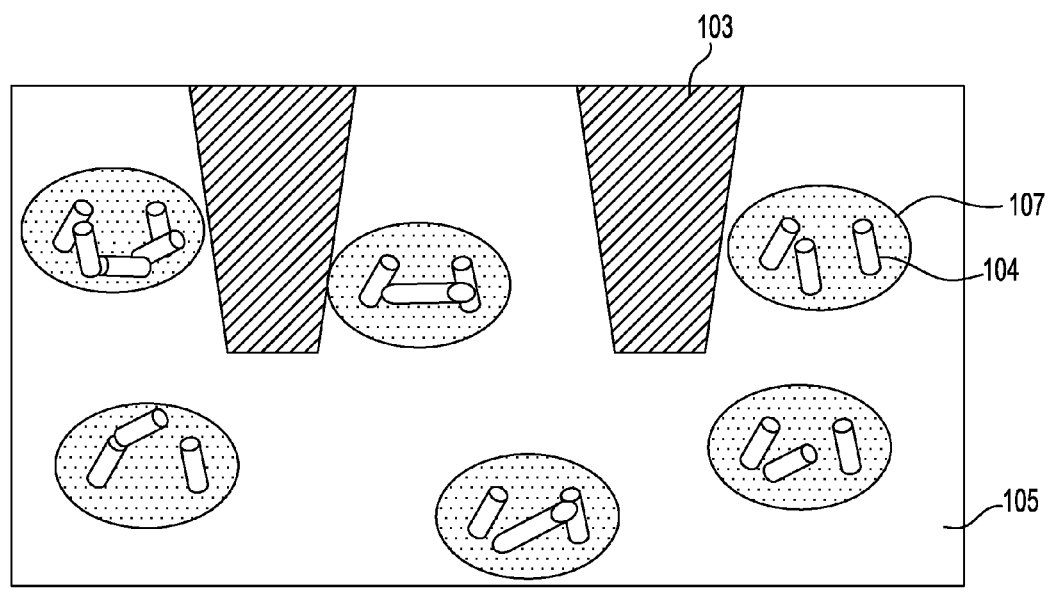
FIG. 4 illustrates a composite dielectric material of the present application that contains directionally random CNT's dispersed within a localized matrix within a low k dielectric material, in accordance with another embodiment of the present application.

In other embodiments as shown, for example in FIG. 4, CNTs 104 are encapsulated in localized matrix 107.

While the present application has been particularly shown and described with respect to preferred embodiments thereof, it will be understood by those skilled in the art that the foregoing and other changes in forms and details may be made without departing from the spirit and scope of the present application. It is therefore intended that the present invention not be limited to the exact forms and details described and illustrated, but fall within the scope of the appended claims.

What is claimed is:

1. A method for forming a dielectric material comprising:
   providing, in any order, a solution containing a low dielectric constant material and another solution containing carbon nanotubes ("CNTs"); and
   depositing the solutions on a surface of a substrate to provide a composite dielectric material, said composite dielectric material having a dielectric constant of 3.5 or less and comprising a first dielectric material, and a second dielectric material comprising said carbon nanotubes (CNTs), wherein said second dielectric material is randomly dispersed in said first dielectric material.

2. The method of claim 1, wherein said solution containing the low dielectric constant material and said another solution containing said CNTs are pre-mixed together prior to introduction into a reactor.

3. The method of claim 1, wherein said solution containing the low dielectric constant material and said another solution containing said CNTs are individually and sequentially deposited on said surface of said substrate.

4. The method of claim 3, wherein said solution containing said low dielectric constant material is deposited prior to depositing said another solution containing said CNTs.

5. The method of claim 1, further comprising curing said composite dielectric material.

6. The method of claim 1, wherein said low dielectric constant material comprises atoms of silicon, carbon, oxygen and hydrogen.

7. The method of claim 1, wherein said CNTs in said another solution have a diameter from 1 nm to 20 nm.

8. The method of claim 1, wherein said CNTs in said another solution have a length from 0.5 nm to 500 μm.

9. The method of claim 1, wherein said CNTs in said another solution are non-metallic or oxidized CNTs.

10. A composite dielectric material comprising:
    a first dielectric material; and
    a second dielectric material comprising carbon nanotubes (CNTs),
    wherein said second dielectric material is randomly dispersed in said first dielectric material and said composite dielectric material having a dielectric constant of 3.5 or less.

11. The composite dielectric material of claim 10, wherein said first dielectric material comprises atoms of silicon, carbon, oxygen, and hydrogen.

12. The composite dielectric material of claim 10, wherein said second dielectric material is encased in a polymer.

13. The composite dielectric material of claim 10, wherein each CNT has a diameter from 1 nm to 20 nm.

14. The composite dielectric material of claim 10, wherein said CNTs are encapsulated in a localized matrix.

15. The composite dielectric material of claim 14, wherein said localized matrix is a silicon based matrix.

16. The composite dielectric material of claim 15, wherein said localized matrix is a SiCOH based matrix.

17. A semiconductor structure comprising:
a substrate having an upper surface; and
a composite dielectric material located on said upper surface of said substrate, said composite dielectric material having a dielectric constant of 3.5 or less and comprising a first dielectric material, and a second dielectric material comprising carbon nanotubes (CNTs), wherein said second dielectric material is randomly dispersed in said first dielectric material.

18. The semiconductor structure of claim 17, wherein said first dielectric material comprises atoms of silicon, carbon, oxygen, and hydrogen.

19. The semiconductor structure of claim 17, wherein said second dielectric material is encased in a polymer.

20. The composite dielectric material of claim 17, wherein each CNT has a diameter from 1 nm to 20 nm.

* * * * *